(12) United States Patent
Sakurai et al.

(10) Patent No.: US 8,603,863 B2
(45) Date of Patent: Dec. 10, 2013

(54) METHOD OF MANUFACTURING CARD

(75) Inventors: Takahiro Sakurai, Tokyo (JP); Yuichi Ito, Tokyo (JP)

(73) Assignee: Toppan Forms Co., Ltd., Tokyo (JP)

( * ) Notice: Subject to any disclaimer, the term of this patent is extended or adjusted under 35 U.S.C. 154(b) by 0 days.

(21) Appl. No.: 13/404,579

(22) Filed: Feb. 24, 2012

(65) Prior Publication Data

US 2012/0156831 A1    Jun. 21, 2012

Related U.S. Application Data

(62) Division of application No. 12/447,731, filed as application No. PCT/JP2007/071661 on Nov. 7, 2007, now abandoned.

(30) Foreign Application Priority Data

Nov. 7, 2006  (JP) ................................ 2006-301519

(51) Int. Cl.
*G06K 19/077*    (2006.01)

(52) U.S. Cl.
USPC ................... 438/118; 235/492; 257/E21.502; 257/E23.064; 438/106

(58) Field of Classification Search
USPC ................... 438/118, 106; 257/E21.499, 679, 257/E23.064, E21.502; 235/492
See application file for complete search history.

(56) References Cited

U.S. PATENT DOCUMENTS

| 5,399,847 | A | 3/1995 | Droz | |
|---|---|---|---|---|
| 5,955,021 | A | 9/1999 | Tiffany, III | |
| 6,241,153 | B1 | 6/2001 | Tiffany, III | |
| 6,659,355 | B1 | 12/2003 | Fischer et al. | |
| 6,794,000 | B2* | 9/2004 | Adams et al. | 428/40.1 |
| 6,853,087 | B2* | 2/2005 | Neuhaus et al. | 257/778 |
| 6,942,156 | B2 | 9/2005 | Ohta et al. | |
| 7,459,341 | B2* | 12/2008 | Usami | 438/107 |
| 2005/0019989 | A1 | 1/2005 | Droz | |
| 2005/0212406 | A1* | 9/2005 | Daniels et al. | 313/503 |
| 2006/0124350 | A1 | 6/2006 | Droz | |
| 2008/0042266 | A1 | 2/2008 | Kagaya et al. | |

FOREIGN PATENT DOCUMENTS

| DE | 103 43 734 A1 | 4/2005 |
|---|---|---|
| JP | 9 123650 | 5/1997 |
| JP | 2001 525968 | 12/2001 |
| JP | 2005 531126 | 10/2005 |
| JP | 2006 503424 | 1/2006 |

\* cited by examiner

*Primary Examiner* — John C Ingham
(74) *Attorney, Agent, or Firm* — Oblon, Spivak, McClelland, Maier & Neustadt, L.L.P.

(57) ABSTRACT

This IC card is provided with a module having an inlet, an adhesive layer covering the module, and a first base material and second base material sandwiching the module with interposition of the adhesive layer. The module is disposed on one face of the first base material with interposition of a viscous layer which has a thickness that varies according to the thickness at each area of the module, and its two ends are narrower than its other parts when viewed from the outer face side of the first base material or the outer face side of the second base material. According to this IC card, it is possible to offer the IC card with a flat surface, and without occurrence of strain in the embedded IC chip.

7 Claims, 6 Drawing Sheets

METHOD OF MANUFACTURING CARD

CROSS REFERENCE TO RELATED APPLICATION

The present application is a divisional of U.S. application Ser. No. 12/447,731, filed on Apr. 29, 2009, which was the National Stage of International Application No. PCT/JP2007/071661, filed on Nov. 7, 2007, which claimed priority to Japanese Application No. 2006-301519, filed on Jul. 11, 2006. Application Ser. No. 12/447,731 is hereby incorporated by reference in its entirety.

TECHNICAL FIELD

The present invention relates to an IC card, which receives information from the outside using the medium of electromagnetic waves, and which is capable of transmitting information to the outside, as with information recording media for RFID (Radio Frequency Identification) applications, and to a manufacturing method thereof. In particular, the present invention relates to an IC card constituted by a pair of base materials sandwiching a module having an inlet composed of a foundational base material and an interconnected antenna and IC chip provided on one face thereof, and to the manufacturing method thereof.

This application claims priority from Japanese Patent Application No. 2006-301519 filed on Nov. 7, 2006, the content of which is incorporated herein by reference.

BACKGROUND ART

Heretofore, in order to adapt information recording media for RFID applications to IC cards such as cash cards and the like, IC cards have been proposed which are constituted by paired base material sandwiching a module having an inlet composed of a foundational base material and an interconnected antenna and IC chip provided on one face thereof.

FIG. 10 is schematic sectional drawing which shows one example of a conventional IC card.

An IC card 100 of this example is schematically configured from an inlet 104 composed of a foundational base material 101 and an interconnected antenna 102 and IC chip 103 provided on one face 101a thereof, an adhesive layer 105 covering this inlet 104, and paired base material 106A and 106B sandwiching the inlet 104 via this adhesive layer 105.

Next, the manufacturing method of this IC card 100 is described with reference to FIG. 11.

To manufacture this IC card 100, first, the inlet 104 is disposed on one face 106a of the base material 106A composed of thermoplastic resin with interposition of a hot-melt adhesive agent 105A constituting the adhesive layer 105. Next, a base material 106B is superimposed on this inlet 104 with interposition of a hot-melt adhesive agent 105B. Next, hot-press treatment is conducted from the outer sides of the base material 106A and 106B, and the hot-melt adhesive agents 105A and 105B are fused, whereby the IC card 100 is obtained by integration of the inlet 104, hot-melt adhesive agents 105A and 105B, and base material 106A and 106B (see, e.g., Patent Document 1).

FIG. 12 is a schematic sectional drawing which shows another example of a conventional IC card.

An IC card 110 of this example is schematically configured from an inlet 114 composed of a foundational base material 111 and an interconnected antenna 112 and IC chip 113 provided on one face 111a thereof, a first intermediate base material 115 disposed on the outer edge of this inlet 114, a second intermediate base material 116 which provides an insertion port 116a for insertion of the IC chip 113, and which is superimposed onto the inlet 114 and first intermediate base material 115, and paired base material 117A and 117B sandwiching the inlet 114, first intermediate base material 115, and second intermediate base material 116.

Next, the manufacturing method of this IC card 110 is described with reference to FIG. 13.

To manufacture this IC card 110, first, the first intermediate layer 115 composed of thermoplastic resin is disposed on the outer edge of the inlet 114. Next, by means of an adhesive agent 118, the inlet 114 and first intermediate layer 115 are provisionally bonded to one face 117a of the base material 117A composed of thermoplastic resin. Next, the second intermediate base material 116 composed of thermoplastic resin is superimposed onto the inlet 114 so that the IC chip 113 is inserted into the insertion port 116a, and the base material 117B is superimposed onto this second intermediate base material 116. Next, hot-press treatment is conducted from the outer sides of the base material 117A and 117B to fuse the first base material 115, second base material 116, and base material 117A and 117B, whereby the IC card 110 is obtained by integration of the inlet 114, first intermediate base material 115, second intermediate base material 116, and base material 117A and 117B (see, e.g., Patent Document 2).

Patent Document 1: Japanese Translation of PCT Application, Publication No. 2005-531126.

Patent Document 2: Japanese Translation of PCT Application, Publication No. 2006-503424.

DISCLOSURE OF THE INVENTION

Problems that the Invention is to Solve

However, as shown in FIG. 10, in the IC card 100, there is severe irregularity in the surface of the inlet 104, because the thickness of the IC chip 103 is larger than that of the other components. As a result, irregularity also occurs in the surface of the IC card 100, and that the surface is not flat. Moreover, in a state where irregularities exist in the IC card 100 in this manner, it is possible that strains may arise in the embedded IC chip 103, leading to breakage of the IC chip 103. Furthermore, as the hot-melt adhesive agent is used in the IC card 100, there is the problem that the inlet 104 is shifted from its prescribed position due to the flow of the adhesive agent when melting this adhesive agent to form the card.

As shown in FIG. 12, with respect to the IC card 110, although the IC chip 113 is inserted into the insertion port 116a provided in the second intermediate base material 116, merely offsetting the thickness of the IC chip 113 is not sufficient to offset irregularity caused by the other components in the case where complex irregularity exists in the surface of the inlet 114. Consequently, there is the problem that irregularity exists in the surface of the IC card 110 as before.

The present invention was made in light of the foregoing circumstances, and its object is to offer an IC card with a flat surface, and without occurrence of strain in the embedded IC chip, and manufacturing method thereof.

Means for Solving the Problems

The IC card of the present invention is provided with a module having an inlet, an adhesive layer covering the pertinent module, and a first base material and second base material sandwiching the aforementioned module with interposition of the pertinent adhesive layer. The aforementioned module is disposed at least on a face of the aforementioned first base material that contacts the aforementioned adhesive layer, with interposition of a viscous layer which has a thickness that varies according to the thickness at each area of the aforementioned module. When viewed from the outer face side of the aforementioned first base material or the outer face side of the aforementioned second base material, the aforementioned viscous layer has at least one end that is narrower than its other parts.

The manufacturing method of the IC card of the present invention is the manufacturing method of an IC card provided with a module having an inlet, an adhesive layer covering the pertinent module, and a first base material and second base material sandwiching the aforementioned module with interposition of the pertinent adhesive layer. The method includes: a step in which a viscosity agent with a thickness that varies according to the thickness at each area of the aforementioned module is applied or pasted onto one face of the aforementioned first base material; a step in which an adhesive agent constituting the aforementioned adhesive layer is applied to one face of the aforementioned first base material; a step in which the aforementioned module is disposed on one face of the aforementioned first base material with interposition of the aforementioned viscosity agent; a step in which the aforementioned second base material is disposed so that the aforementioned first base material and the aforementioned second base material sandwich the aforementioned module, the aforementioned viscosity agent, and the aforementioned adhesive agent; and a step in which the aforementioned first base material and the aforementioned second base material are subjected to pressurizing treatment from their outer sides and from one of their ends in the flow direction of the aforementioned adhesive agent. In the manufacturing step in which the aforementioned viscosity agent is applied, the aforementioned viscosity agent is applied so that the ends of the aforementioned viscosity agent are oriented in the flow direction of the aforementioned adhesive agent, and said viscosity agent is applied in a spaced side-by-side manner in a thickness that varies according to the thickness at each area of the aforementioned module.

In the manufacturing step in which the adhesive agent is applied to one face of the aforementioned first base material, it is preferable that the aforementioned adhesive agent be applied in multiple stripes.

Effects of the Invention

The IC card of the present invention is provided with a module having an inlet, an adhesive layer covering the pertinent module, and a first base material and second base material sandwiching the aforementioned module with interposition of the pertinent adhesive layer; the module is disposed on at least the face of the first base material that contacts the adhesive layer with interposition of a viscous layer having a thickness that varies according to the thickness at each area of the aforementioned module; and the viscous layer has at least one end that is narrower that its other parts when viewed from the outer face side of the first base material or the outer face side of the second base material. Consequently, the module is disposed approximately parallel to the first base material and second base material without bending between them, and the adhesive layer is formed in the regions apart from the viscous layer between the module and the first base material/second base material. Accordingly, no irregularity exists in the surface of the IC card originating in irregularity of the module. As a result, the surface of the IC card is flat. Moreover, as strain is not produced in the IC chip due to bending of the module, there is no breakage of the IC chip due to such strain. Consequently, the IC card of the present invention can be used stably over long periods.

According to the manufacturing method of the IC card of the present invention, with respect to the manufacturing step in which the viscosity agent is applied or pasted, the viscosity agent is applied so that the ends of the viscosity agent are oriented in the flow direction of the adhesive agent, and the viscosity agent is provided in a spaced side-by-side manner with variation of its thickness according to the thickness at each area of the module. Consequently, not only is it possible to dispose the module more stably between and in parallel to the first base material and second base material, but it is also possible to have the adhesive agent flow without lacunae between the module and the first base material in the manufacturing step involving pressurizing treatment. Accordingly, it is possible to fabricate an IC card in which the entirety of the module is covered by the adhesive agent between the first base material and second base material.

BRIEF DESCRIPTION OF THE REFERENCE SYMBOLS

10 . . . IC card, 11 . . . inlet, 12, 32 . . . module, 13 . . . adhesive layer, 14, 34 . . . first base material, 15, 35 . . . second base material, 16 . . . foundational base material, 17 . . . antenna, 18 . . . IC chip, 19 . . . electronic component, 20 . . . connector, 21, 22, 23 . . . viscous layer, 33 . . . adhesive agent, 41, 42, 43 . . . viscosity agent.

BEST MODE FOR CARRYING OUT THE INVENTION

The IC card of the present invention and manufacturing method thereof will not be described. This embodiment is described with specificity in order to facilitate understanding of the intent of the present invention, but it does not limit the present invention, absent a specific designation to that effect.

(IC Card)

Figure 1A:
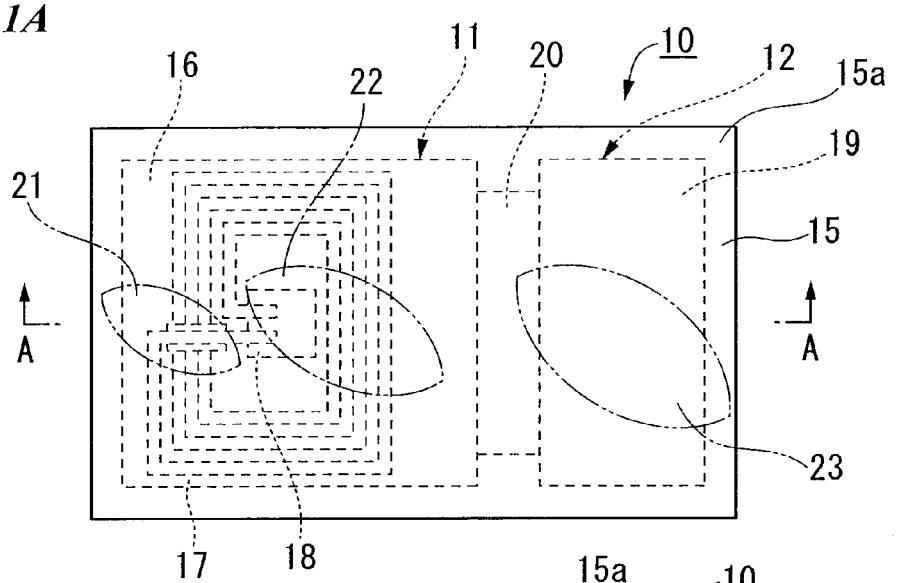
FIG. 1A is a schematic plan view which shows one embodiment of the IC card of the present invention.
Figure 1B:
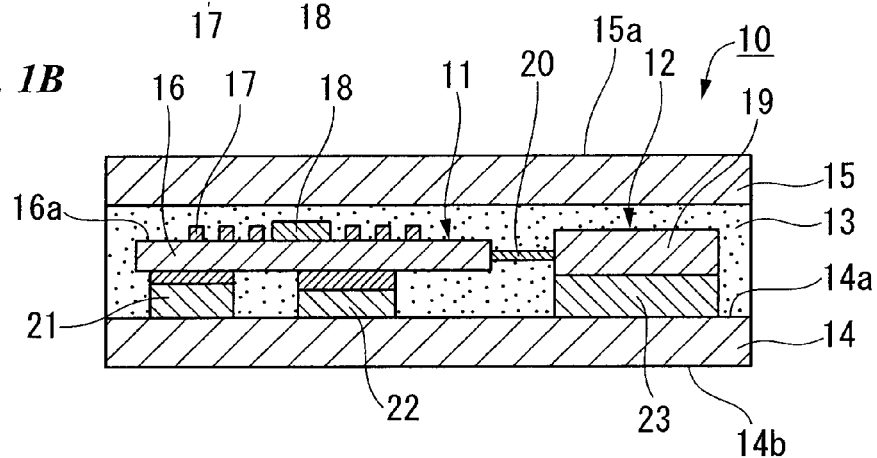
FIG. 1B is a sectional view along the A-A line of FIG. 1A, which shows one embodiment of the present invention.

FIG. 1A and FIG. 1B are schematic diagrams which show one embodiment of the IC card pertaining to the present invention. FIG. 1A is a plan view, and FIG. 1B is a sectional view along the A-A line of FIG. 1A.

In the drawings, code number 10 indicates an IC card, 11 indicates an inlet, 12 indicates a module, 13 indicates an adhesive layer, 14 indicates a first base material, 15 indicates a second base material, 16 indicates a foundational base material, 17 indicates an antenna, 18 indicates an IC chip, 19 indicates an electronic component, 20 indicates a connector, 21, 22, 23 indicate a viscous layer.

An IC card 10 of this embodiment is schematically configured from a module 12 having an inlet 11, an adhesive layer 13 covering this module 12, a first base material 14 and second base material 15 sandwiching the module 12 with interposition of this adhesive layer 13, and a viscous layer 21, 22 and 23 provided between the module 12 and the first base material 14.

The module 12 is disposed on a face 14a of the first base material 14 that contacts the adhesive layer 13 with interposition of the viscous layer 21, 22 and 23 which has a thickness that varies according to the thickness at each area of the module 12. When viewed from the other face (hereinafter, "outer face") 14b side of the first base material 14 and the outer face 15a side of the second base material 15, the viscous layer 21, 22 and 23 has a fusiform shape such that its two ends are narrower than its other parts.

Furthermore, the viscous layer 21, 22 and 23 is provided in a spaced side-by-side manner on a portion of the face on the side opposite the face 14a of the first base material 14 at each area of the module 12.

The adhesive layer 13 is formed in the regions apart from the viscous layer 21, 22 and 23 between the module 12 and the first base material 14.

The inlet 11 is schematically configured from the foundational base material 16, and the interconnected and coil-shaped antenna 17 and IC chip 18 provided on a face 16a of the foundational base material 16.

The module 12 is schematically configured from this inlet 11, an electronic component 19, and conductive material 20 composed of a conductive wire connected to these.

As the thickness of the electronic component 19 and of the member configuring the inlet 11 varies, the surface or rear face of the module 12 is uneven.

As the adhesive agent constituting the adhesive layer 13, an adhesive agent is used which is a liquid before use, and which is hardened by application of external conditions such as heating, ultraviolet-ray irradiation, electron-ray irradiation or the like. As this type of adhesive agent, thermohardening resin, ultraviolet-ray hardening resin, and electron-ray hardening resin may be employed. A 2-pack hardening adhesive which is hardened by reacting a hardener with a main ingredient without application of external conditions may be used.

As thermohardening resin, for example, phenol resin, epoxy resin, polyurethane hardening resin, urea resin, melamine resin, acrylic reactive resin, and so on, may be employed.

As ultraviolet-ray hardening resin, ultraviolet-ray hardening acrylic resin, ultraviolet-ray hardening urethane acrylate resin, ultraviolet-ray hardening polyester acrylate resin, ultraviolet-ray hardening polyurethane resin, ultraviolet-ray hardening epoxy acrylate resin, ultraviolet-ray hardening imide acrylate resin, and so on, may be employed.

As electronic-ray hardening resin, electronic-ray hardening acrylic resin, electronic-ray hardening urethane acrylate resin, electronic-ray hardening polyester acrylate resin, electronic-ray hardening polyurethane resin, electronic-ray hardening epoxy acrylate resin, cationic hardening resin, and so on, may be employed.

As a 2-pack hardening adhesive, mixtures of polyester resin and polyisocyanate prepolymer, mixtures of polyester polyol and polyisocyanate, mixtures of urethane and polyisocyanate, and so on, may be employed.

As specific examples of such adhesives, a 2-pack epoxy adhesive composed of a main ingredient (brand name: Aron Mighty AP-317A, manufactured by Toagosei Co.) and a hardener (brand name: Aron Mighty AP-317B, manufactured by Toagosei Co.), and a 2-pack urethane adhesive composed of a main ingredient (brand name: MLT2900, manufactured by E-Tec Co.) and a hardener (brand name: G3021-B174, manufactured by E-Tec Co.) may be employed As the first base material 14 and second base material 15, base material composed of polyester resin such as polyethylene terephthalate (PET), glycol-modified polyethylene terephthalate (PET-G), polybutylene terephthalate (PBT), and polyethylene napthalate (PEN); base material composed of polyolefin resin such as polyethylene (PE) and polypropylene (PP); base material composed of ethylene polyfluoride resin such as vinyl polyfluoride, vinylidene polyfluoride, and ethylene poly-4-fluoride; base material composed of polyamide resin such as nylon 6, and nylon 6,6; base material composed of vinyl polymer such as polyvinyl chloride (PVC), ethylene vinyl acetate copolymer, polyvinyl alcohol, and vinilon; base material composed of acrylic resin such as methyl polymethacrylate, ethyl polymethacrylate, ethyl polyacrylate, and butyl polyacrylate; base material composed of polystyrene; base material composed of polycarbonate (PC); base material composed of polyallylate; base material composed of polyimide; base material composed of paper such as high-quality paper, thin paper, glassine paper, parchment paper; and so on, may be used. Among these base materials, from the standpoints of mechanical strength, dimensional stability and solvent resistance, it is preferable to use base material composed of polyethylene terephthalate (PET), glycol-modified polyethylene terephthalate (PET-G), polyethylene napthalate (PEN), and the like. In terms of transparency, processing suitability and cost, base material composed of polyethylene terephthalate (PET) or glycol-modified polyethylene terephthalate (PET-G) is particularly preferable.

As the base material 16, at least with respect to its surface layer, or more materials may be selected from various conventionally known materials such as cloth, nonwoven cloth, matting, and paper—or combinations of these—composed of inorganic fiber such as glass fiber and alumina fiber; cloth, nonwoven cloth, matting, and paper—or combinations of these—composed of organic fiber such as polyester fiber and polyamide fiber; or composite base material molded by impregnating these with resin varnish; or plastic base material such as polyamide resin base material, polyester resin base material, polyolefin resin base material, polyimide resin base material, ethylene-vinyl alcohol copolymer base material, polyvinyl alcohol resin base material, polyvinyl chloride resin base material, polyvinilidine chloride resin base material, polystyrene resin base material, polycarbonate resin base material, acrylonitrile butadiene styrene copolymer resin base material, and polyether-sulfone resin base material; or material obtained by subjecting these to surface treatment such as matting treatment, corona discharge treatment, plasma treatment, ultraviolet-ray irradiation treatment, electronic-ray irradiation treatment, frame plasma treatment, ozone treatment, or various types of adhesion facilitating treatment. Among these, electrically insulated films or sheets composed of polyethylene terephthalate or polyimide are particularly well suited for use.

The antenna 17 is formed by screen printing in a prescribed pattern using a polymer type conductive ink on the face 16*a* of the foundational base material 16, or it may be constituted by etching conductive foil, or by metal plating may be used.

As the polymer type conductive ink, for example, conductive particulate such as silver powder, gold powder, platinum powder, aluminum powder, palladium powder, rhodium powder, and carbon powder (such as carbon black and carbon nanotubes), which is blended into a resin composition, may be used As a resin composition, conventionally known materials such as thermohardening resin, photohardening resin, osmotic drying resin, and solvent-volatile resin may be used.

There are no particular limitations with respect to the IC chip 18, and any type of chip may be used so long as it enables the writing and reading of information via the antenna 17 in a non-contact state, and so long as it may be applied to RFID media such as non-contact IC tags and non-contact IC labels, or non-contact IC cards.

As the electronic component 19, the foundational base material and a component such as a battery, diode, or antenna, may be employed As the viscosity agent constituting the viscous layer 21, 22 and 23, a viscosity agent is used which has the properties of both a liquid and a solid, which is constantly in a wet state, which has low fluidity, and which retains its own shape. As this type of viscosity agent, acrylic resin, polyurethane resin, epoxy resin, urethane resin, natural rubber viscosity agents, synthetic rubber viscosity agents, hot-melt viscosity agents, and so on, may be used. As specific examples of viscosity agents, double-sided film tape (brand name: No. 705, manufactured by Teraoka Seisakusho Co.), double-sided tape (brand name: TL-85F-12, manufactured by Lintec Corporation), and so on may be employed.

With respect to the IC card 10 of this embodiment, the module 12 is disposed on the face 14*a* of the first base material 14 with interposition of a viscous layer 21, 22 and 23 having a thickness that varies according to the thickness at each area of the module 12. Moreover, when viewed from the outer face 14*b* side of the first base material 14 and the outer face 15*a* side of the second base material 15, the viscous layer 21, 22 and 23 has a fusiform shape such that its two ends are narrower than its other parts. Consequently, as the module 12 is disposed approximately parallel to the first base material 14 and second base material 15 without bending between them, and as the adhesive layer 13 is formed in the region apart from the viscous layer 21, 22 and 23 between the module 12 and the first base material 14/second base material 15, no irregularity exists in the surface of the IC card 10 originating in irregularity of the module 12. Accordingly, the surface of the IC card 10 is flat. Moreover, as strain is not produced in the IC chip 18 due to bending of the module 12, there is no breakage of the IC chip 18 due to such strain. Furthermore, as a hot-melt adhesive agent is not used as the adhesive agent constituting the adhesive layer 13, the module 12 can be disposed at its prescribed position without any shifting of the module 12 from its prescribed position due to the flow of adhesive agent during formation of the card. Consequently, the IC card 10 can be used stably over long periods.

In this embodiment, an IC card 10 was exemplified in which the viscous layer 21, 22 and 23 has a fusiform shape such that its two ends are narrower than its other parts when viewed from the outer face 14*b* side of the first base material 14 and the outer face 15*a* side of the second base material 15, but the IC card of the present invention is not limited thereto.

In the IC card of the present invention, it is sufficient if at least one of the ends of the viscous layer is narrower than its other parts when viewed from the outer face side of the first base material or the outer face side of the second base material.

Figure 2:
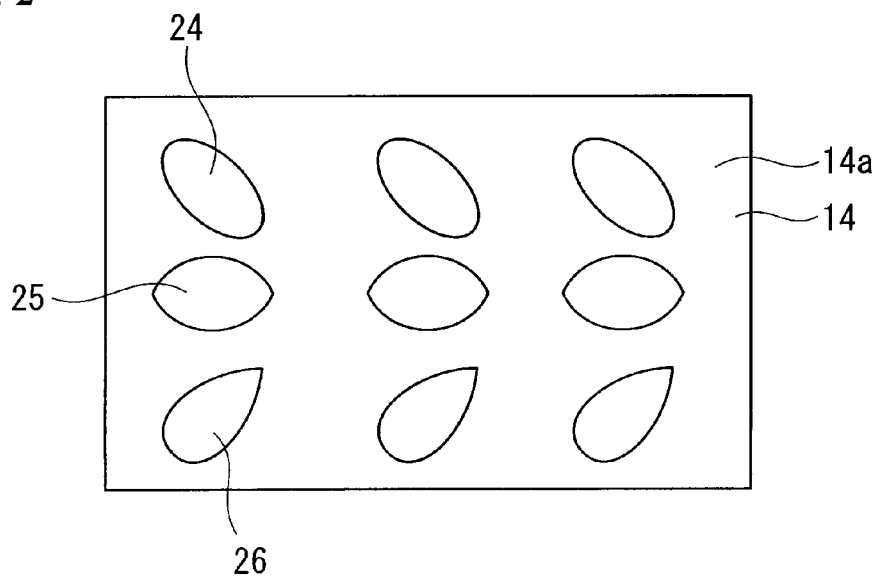
FIG. 2 is a schematic plan view which shows a viscous layer configuring the IC card pertaining to the present invention.

That is, as shown in FIG. 2, the viscous layer of the IC card of the present invention may be constituted in an oval shape, as in the viscous layer 24, such that its two ends are narrower than its other parts when viewed from the outer face 14*b* side of the first base material 14 and the outer face 15*a* side of the second base material 15. As in the viscous layer 25, the viscous layer of the IC card of the present invention may also have a fusiform shape such that its two ends are narrower than its other parts when viewed from the outer face 14*b* side of the first base material 14 and the outer face 15*a* side of the second base material 15. As in the viscous layer 26, the viscous layer of the IC card of the present invention may also have a teardrop shape (a shape in which one end is rounded, and the other end is tapered) such that one end thereof is narrower than its other parts when viewed from the outer face 14*b* side of the first base material 14 and the outer face 15*a* side of the second base material 15. Furthermore, the viscous layer may also adopt rhomboidal, triangular or other shapes when viewed from the outer face side of the first base material and the outer face side of the second base material.

Moreover, in this embodiment, the IC card 10 was exemplified in which the viscous layer 21, 22 and 23 is provided between the module 12 and the first base material 14, but the IC card of the present invention is not limited thereto. In the IC card of the present invention, it is also acceptable to provide a viscous layer between the module and the second base material such that the viscous layer has a thickness that varies according to the thickness at each area of the module.

Furthermore, in this embodiment, the IC card 10 was exemplified in which the viscous layer 21, 22 and 23 is provided in individual segments at each area of the module 12, but the IC card of the present invention is not limited thereto. In the IC card of the present invention, as shown in FIG. 2, it is acceptable to provide multiple viscous layers at each area of the module. If multiple viscous layers are provided in this manner, it is possible to dispose the module more stably between and in parallel to the first base material and second base material.

In this embodiment, the IC card 10 was exemplified in which the viscous layer 21, 22 and 23 is provided such that its two ends are diagonal relative to in the longitudinal direction of the first base material 14, but the IC card of the present invention is not limited thereto. In the IC card of the present invention, as with the viscous layer 25 shown in FIG. 2, it is also acceptable to provide the viscous layer such that its two ends are parallel to the longitudinal direction of the first base material or second base material.

(Manufacturing Method of IC Card)

Next, the manufacturing method of the IC card of the present invention is described with reference to FIG. 3 to FIG. 8.

Figure 3:
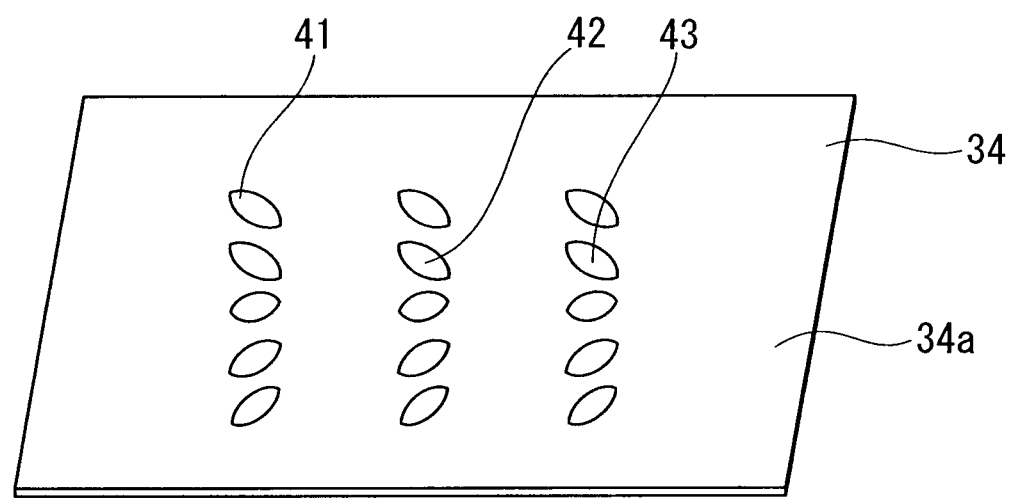
FIG. 3 is a schematic oblique view which shows the method of manufacture of the IC card of the present invention.

First, as shown in FIG. 3, a viscosity agent 41, 42 and 43 is applied or pasted in a spaced side-by-side manner onto a face 34a of a first base material 34 so that its ends are oriented toward the flow direction of the adhesive agent, and so that its thickness varies according to the thickness at each area of a below-mentioned module 32 (manufacturing step in which viscosity agent is applied or pasted).

In the manufacturing method of the IC card of this embodiment, the flow direction of the adhesive agent is the direction in which the adhesive agent flows during hot-press treatment for the purpose of forming the IC card by pasting together the first base material 34 and a below-mentioned second base material 35. In this embodiment, as the adhesive agent is applied in the longitudinal direction of the first base material 34, the direction of this application is approximately the same as the flow direction of the adhesive agent.

Figure 4:
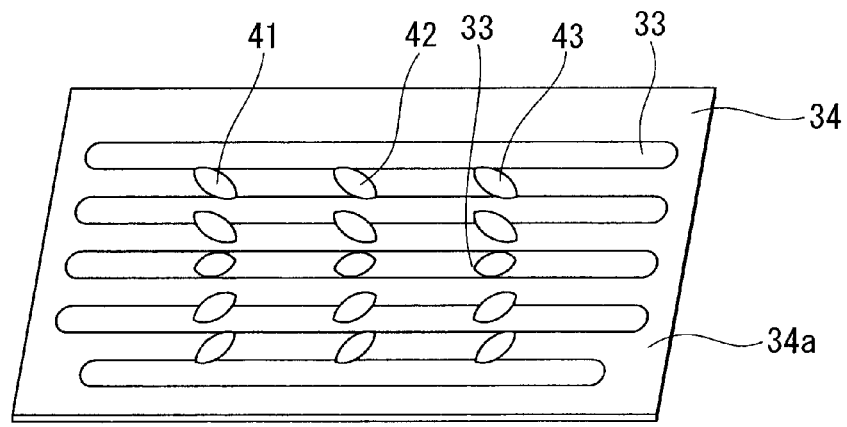
FIG. 4 is a schematic oblique view which shows the manufacturing method of the IC card of the present invention.

Next, as shown in FIG. 4, an adhesive agent 33 is applied in multiple stripes in the longitudinal direction of the first base material 34 on the face 34a of the first base material 34 (manufacturing step in which adhesive agent is applied).

Figure 5:
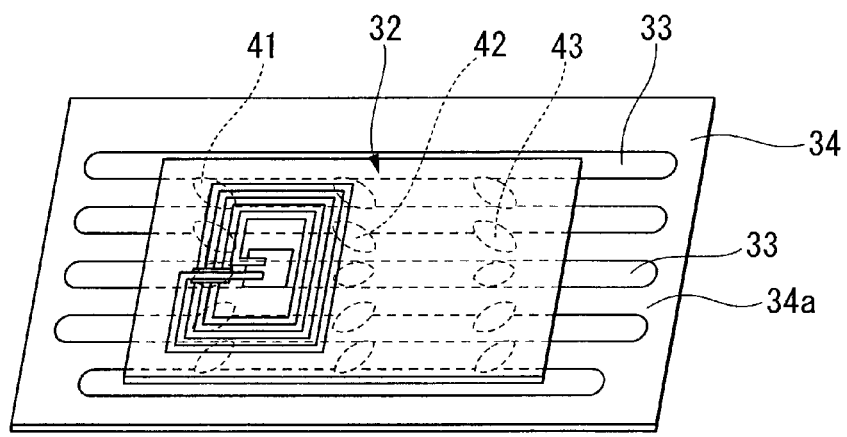
FIG. 5 is a schematic oblique view which shows the manufacturing method of the IC card of the present invention.

Next, as shown in FIG. 5, the module 32 is disposed at a prescribed position of the face 34a of the first base material 34 with interposition of the viscosity agent 41, 42 and 43.

Figure 6:
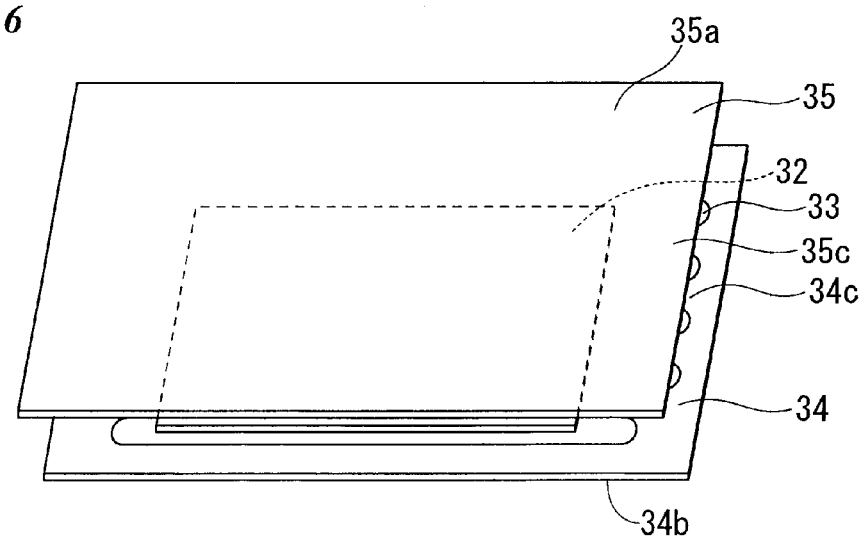
FIG. 6 is a schematic oblique view which shows the manufacturing method of the IC card of the present invention.

Next, as shown in FIG. 6, the second base material 35 is disposed so that the module 32, viscosity agent 41, 42, 43, and adhesive agent 33 are sandwiched by the first base material 34 and second base material 35 (manufacturing step in which the module is interposed and held).

Figure 7:
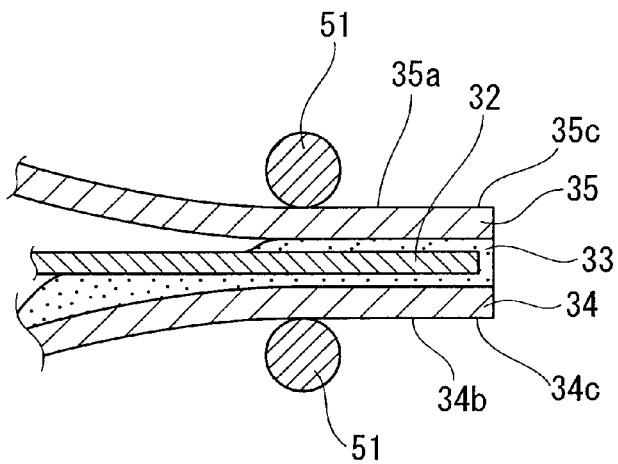
FIG. 7 is a schematic oblique view which shows the manufacturing method of the IC card of the present invention.

Next, as shown in FIG. 7, the laminar body configured from the first base material 34, second base material 35, module 32, viscosity agent 41, 42, 43, and adhesive agent 33 is subjected to hot-press/pressurizing treatment and treatment for hardening the adhesive agent—for example, heating, ultraviolet ray irradiation, electronic ray irradiation, and aging (i.e., shelving, and causing a hardening reaction over time)—from the outer face 34b side of the first base material 34 and the outer face 35a side of the second base material 35, and in the flow direction of the adhesive agent 33 from an end 34c of the first base material 34 and an end 35c of the second base material 35 (the manufacturing step in which pressurizing and adhesive agent hardening treatment are conducted), whereby the adhesive agent 33 is hardened, and the aforementioned laminar body is integrated to obtain the IC card.

In the manufacturing step in which this pressurizing treatment is conducted, in order to subject the aforementioned laminar body to heating and pressurizing, the laminar body is pressed from the outer face 34b side of the first base material 34 and the outer face 35a side of the second base material 35 by pressure rolls 51, 51, as shown in FIG. 7.

Figure 8:
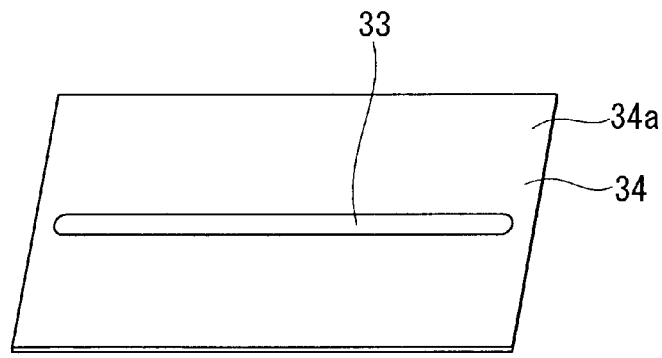
FIG. 8 is a schematic oblique view which shows the manufacturing method of the IC card of the present invention.
Figure 9:
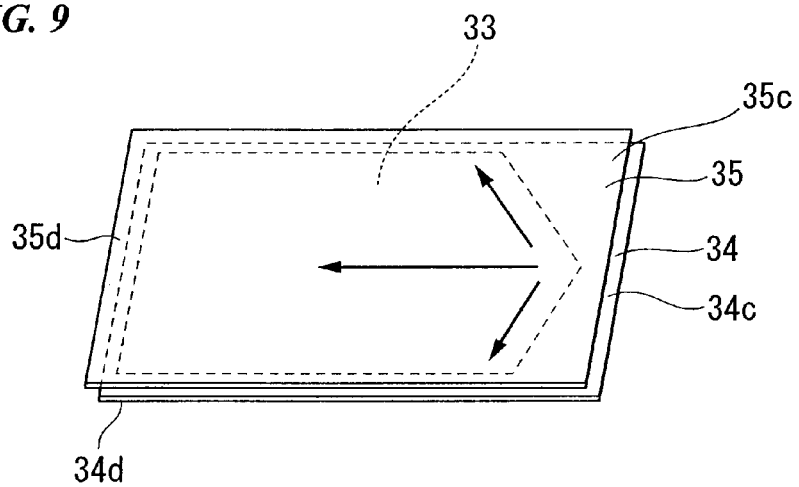
FIG. 9 is a schematic oblique view which shows the manufacturing method of the IC card of the present invention.
Figure 10:
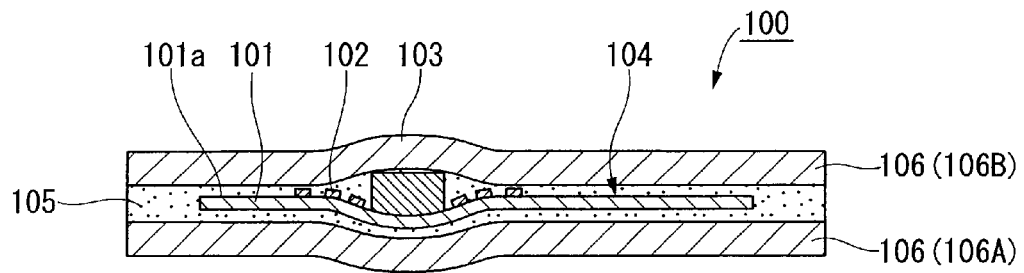
FIG. 10 is a schematic sectional view which shows one example of a conventional IC card.
Figure 11:
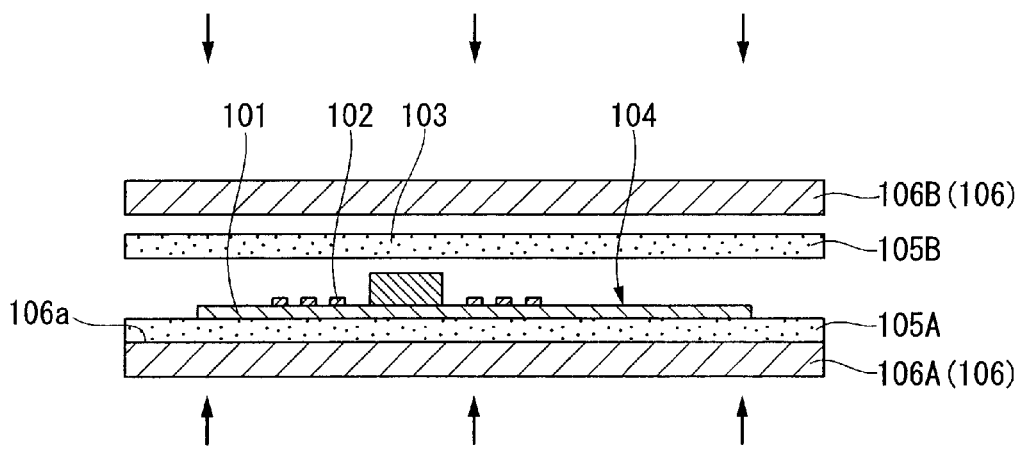
FIG. 11 is a schematic sectional view which shows one example of the manufacturing method of a conventional IC card.
Figure 12:
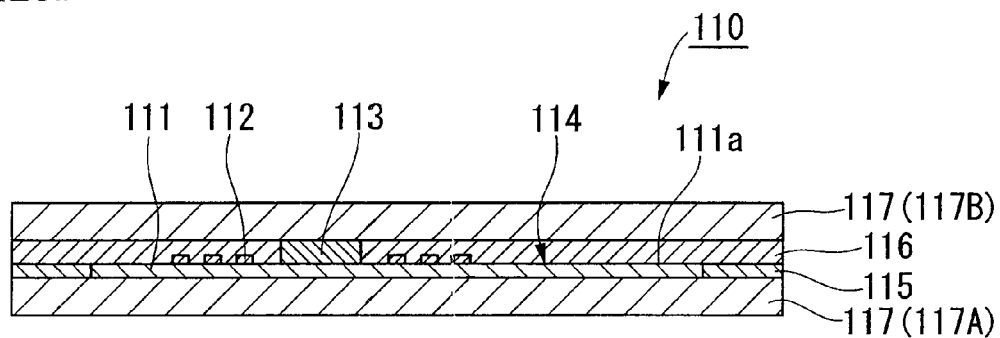
FIG. 12 is a schematic sectional view which shows another example of a conventional IC card.
Figure 13:
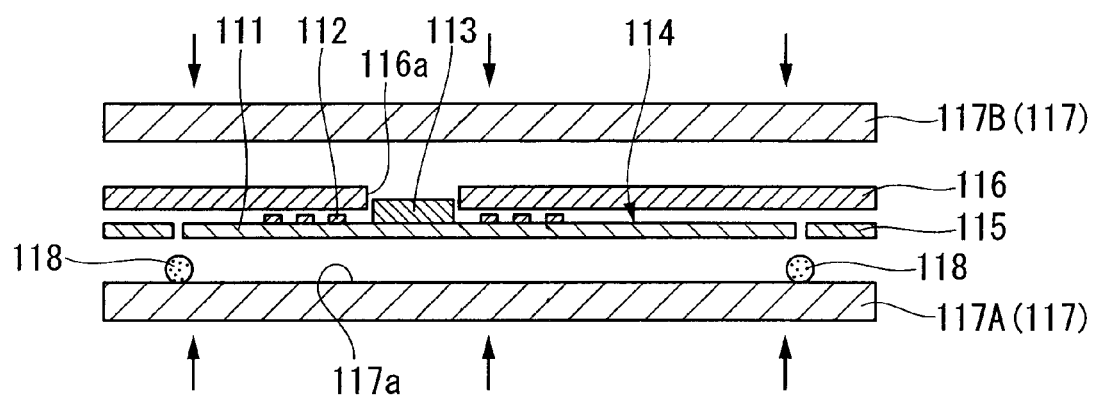
FIG. 13 is a schematic sectional view which shows another example of the manufacturing method of a conventional IC card.

As a result of this pressurizing treatment, for example, the adhesive agent 33 applied to the face 34a of the first base material 34, as shown in FIG. 8, is spread from the end 34c of the first base material 34 and the end 35c of the second base material 35 toward the two long sides of the first base material 34 and the two long sides of the second base material 35, and toward the other end 34d of the first base material 34 and the other end 35d of the second base material 35, as shown in FIG. 9, whereby the module 32 is finally in a state where it is entirely covered by the adhesive agent 33.

With respect to the manufacturing method of IC card of this embodiment, in the manufacturing step in which the viscosity agent is applied or pasted, the viscosity agent 41, 42, 43 is applied in a spaced side-by-side manner to one face 34a of the first base material 34 so that its ends are oriented in the flow direction of the adhesive agent, and so that its thickness varies according to the thickness at each area of the below-mentioned module 32. Consequently, not only can the module 32 be more stably disposed between and in parallel to the first base material 34 and second base material 35, but it is also possible to have the adhesive agent 33 flow without lacunae among the viscosity agent 41, 42, 43 in the manufacturing step in which pressurizing treatment is conducted, with the result that the adhesive agent 33 can be made to flow without lacunae between the module 32 and the first base material 34. Accordingly, the IC card is obtained in which the entirety of the module 32 is covered by the adhesive agent 33 between the first base material 34 and second base material 35.

In the manufacturing method of IC card of this embodiment, as the adhesive agent 33 is applied in multiple stripes to the face 34a of the first base material 34 in the longitudinal direction of the first base material 34 in the manufacturing step in which the adhesive agent is applied, it is possible to have the adhesive agent 33 extend more uniformly between the module 32 and first base material 34/second base material 35. Accordingly, adhesion defects of the module 32 and first base material 34/second base material 35 can be prevented.

In this embodiment, the adhesive agent 33 is applied in multiple stripes to the face 34a of the first base material 34 in the longitudinal direction of the first base material 34 in the manufacturing step in which the adhesive agent is applied, but the manufacturing method of IC card of the present invention is not limited thereto. In the manufacturing method of IC card of the present invention, the application amount of adhesive agent can be suitable adjusted according to the size, degree of surface irregularity, etc. of the embedded module.

Moreover, in this embodiment, the case was exemplified in which an IC card is manufactured by sandwiching a single module 32 by the paired base material of the first base material 34 and second base material 35, but the manufacturing method of IC card of the present invention is not limited thereto. In the manufacturing method of IC card of the present invention, it is also acceptable to manufacture the IC card by serially disposing multiple modules between paired base material of large area, forming the card of large area in which multiple modules are embedded, and dividing this card by each embedded module.

INDUSTRIAL APPLICABILITY

According to the present invention, it is possible to offer an IC card with a flat surface, and without occurrence of strain in the embedded IC chip, and manufacturing method thereof.

The invention claimed is:

1. A method of manufacturing a card provided with a module, an adhesive layer covering the module, and a first base material and a second base material sandwiching the module with interposition of the adhesive layer, comprising:
   a viscosity agent placement step of placing a viscosity agent onto one surface of the first base material by applying or pasting;
   an adhesive agent application step of applying an adhesive agent to constitute the adhesive layer onto the one surface of the first base material;
   a module placement step of placing the module onto the one surface of the first base material with interposition of the viscosity agent, at least after the viscosity agent placement step;
   a second base material placement step of placing the second base material so that the first and second base materials sandwich the module, the viscosity agent, and the adhesive agent, after the adhesive agent application step and the module placement step; and
   a pressurization step of pressurizing the first and second base materials from an outside thereof in a thickness direction thereof, and moving a portion which is pressurized in a pressurization-movement direction from one edge of the first base material and the second base material to one other edge opposite to the one edge so that the adhesive agent flows so as to be extended in the pressurization-movement direction, after the second base material placement step, wherein the viscosity agent is formed so as to have at least a narrower tip than other portions when seen from the outside of the first base material, and disposed on the first base material so that the tip is directed in the pressurization-movement direction, in the viscosity agent placement step.

2. The method of manufacturing a card according to claim 1, wherein the adhesive agent is applied in plural stripes in the adhesive agent application step.

3. The method of manufacturing a card according to claim 2, wherein a longitudinal direction of the plural stripes is substantially parallel to the pressurization-movement direction.

4. The method of manufacturing a card according to claim 1, wherein the adhesive agent application step includes applying the adhesive agent in multiple discrete stripes.

5. The method of manufacturing a card according to claim 4, wherein the multiple discrete stripes are applied in the pressurization-movement direction.

6. The method of manufacturing a card according to claim 1, wherein in the viscosity agent placement step, the viscosity agent is placed in a plurality of viscous layers having a thickness that varies according to a thickness at each area of the module.

7. The method of manufacturing a card according to claim 1, wherein the viscosity agent has a fusiform shape such that two ends of the viscosity agent are narrower than other parts of the viscosity agent.

* * * * *